United States Patent
Kawasaki

(10) Patent No.: US 7,816,739 B2
(45) Date of Patent: Oct. 19, 2010

(54) SEMICONDUCTOR DEVICE USING SIGE FOR SUBSTRATE

(75) Inventor: Hirohisa Kawasaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 844 days.

(21) Appl. No.: 11/619,799

(22) Filed: Jan. 4, 2007

(65) Prior Publication Data

US 2007/0164364 A1 Jul. 19, 2007

(30) Foreign Application Priority Data

Jan. 6, 2006 (JP) ............................. 2006-001812

(51) Int. Cl.
*H01L 29/94* (2006.01)

(52) U.S. Cl. ............... 257/369; 257/371; 257/E29.255; 257/E29.27; 257/E27.067; 438/300

(58) Field of Classification Search ................. 257/369, 257/371, E29.255, E29.27, E27.067; 438/300
See application file for complete search history.

(56) References Cited

U.S. PATENT DOCUMENTS

| 6,593,641 | B1 | 7/2003 | Fitzergald |
| 6,621,131 | B2 | 9/2003 | Murthy et al. |
| 2005/0133819 | A1* | 6/2005 | Kawasaki ................... 257/195 |

FOREIGN PATENT DOCUMENTS

| JP | 2002-237590 | 8/2002 |
| JP | 2004-200335 | 7/2004 |
| JP | 2005-142431 | 6/2005 |

OTHER PUBLICATIONS

T. Ghani, et al., "A 90nm High Volume Manufacturing Logic Technology Featuring Novel 45nm Gate Length Strained Silicon CMOS Transistors," Portland Technology Development, 3 pages, 2003.

* cited by examiner

*Primary Examiner*—Kiesha R Bryant
*Assistant Examiner*—Tucker Wright
(74) *Attorney, Agent, or Firm*—Oblon, Spivak, McClelland, Maier & Neustadt, L.L.P.

(57) ABSTRACT

A semiconductor device includes a first semiconductor layer, an n-type/p-type second semiconductor layer, p-type/n-type third semiconductor layers and a first gate electrode. The second semiconductor layer is formed on the first semiconductor layer and has an oxidation rate which is lower than that of the first semiconductor layer. The third semiconductor layers are formed in the second semiconductor layer and have a depth reaching an inner part of the first semiconductor layer. In case that the second and third semiconductor layers are n-type and p-type, respectively, a lattice constant of the second semiconductor layer is less than that of the third semiconductor layer. In case that the second and third semiconductor layers are p-type and n-type, respectively, the lattice constant of the second semiconductor layer is greater than that of the third semiconductor layer. A first gate electrode is formed on the second semiconductor layer.

11 Claims, 16 Drawing Sheets

SEMICONDUCTOR DEVICE USING SIGE FOR SUBSTRATE

CROSS-REFERENCE TO RELATED APPLICATIONS

This application is based upon and claims the benefit of priority from prior Japanese Patent Application No. 2006-001812, filed Jan. 6, 2006, the entire contents of which are incorporated herein by reference.

BACKGROUND OF THE INVENTION

1. Field of the Invention

The present invention relates generally to a semiconductor device and a method for fabricating the semiconductor device, and relates, for example, to a MOS transistor using SiGe for a substrate.

2. Description of the Related Art

Conventionally, there is known a MOS transistor in which a source region and a drain region are formed by SiGe, as disclosed, for instance, in Jpn. Pat. Appln. KOKAI Publication No. 2005-142431.

In this type of transistor, an epitaxial SiGe is grown on the recessed source/drain region while gate-electrode is covered with hard mask, e.g. SiN, so that SiGe will not grow on it. In this structure, as the depth of the recessed regions increases, a higher compressive stress is induced in a channel region. Thus, the hole mobility of the MOS transistor can be improved.

However, when the source/drain regions are being recessed, there may occur a case in which the hard mask on the gate electrode is eroded and stripped away by the source/drain recess. Consequently, SiGe may grow also on the gate electrode, and this will cause the electrical connection between neighboring MOS transistors. Further, the source/drain and the gate electrode also may be shorted. It is thus difficult to recess into the source/drain region deeply, i.e. the epitaxially grown SiGe layers, and it is hard to further enhance the performance of the MOS transistor.

BRIEF SUMMARY OF THE INVENTION

A semiconductor device according to first aspect of the present invention includes:

a first semiconductor layer;

an n-type second semiconductor layer which is formed on the first semiconductor layer and has an oxidation rate which is lower than an oxidation rate of the first semiconductor layer;

p-type third semiconductor layers which are formed spaced apart in the second semiconductor layer and have a depth reaching an inner part of the first semiconductor layer from a surface of the second semiconductor layer, a lattice constant of the second semiconductor layer being less than a lattice constant of the third semiconductor layer; and a first gate electrode which is formed on the second semiconductor layer between the neighboring third semiconductor layers with a first gate insulation film interposed between the second semiconductor layer and the first gate electrode.

A semiconductor device according to second aspect of the present invention includes:

a first semiconductor layer;

a p-type second semiconductor layer which is formed on the first semiconductor layer and has an oxidation rate which is lower than an oxidation rate of the first semiconductor layer;

n-type third semiconductor layers which are formed spaced apart in the second semiconductor layer and have a depth reaching an inner part of the first semiconductor layer from a surface of the second semiconductor layer, a lattice constant of the second semiconductor layer being greater than a lattice constant of the third semiconductor layer; and a gate electrode which is formed on the second semiconductor layer between the neighboring third semiconductor layers with a gate insulation film interposed between the second semiconductor layer and the gate electrode.

A method for fabricating a semiconductor device according to an aspect of the present invention includes:

forming, on a first semiconductor layer, a second semiconductor layer of a first conductivity type;

forming a gate electrode layer and a mask material on the gate electrode with a gate insulation film interposed between the second semiconductor layer and the gate electrode layer;

etching the mask material and the gate electrode layer, thereby forming a gate electrode;

after forming the gate electrode, etching the second semiconductor layer while gate electrode covered with the mask material is not etched thereby exposing the first semiconductor layer;

oxidizing an exposed surface of the first semiconductor layer under a condition in which an oxidation rate of the first semiconductor layer is higher than an oxidation rate of the second semiconductor layer;

removing oxide films on surfaces of the first and second semiconductor layers by a wet process; and epitaxially growing a third semiconductor layer of a second conductivity type on the surfaces of the first and second semiconductor layers from which the oxide films are removed.

DETAILED DESCRIPTION OF THE INVENTION

Figure 1:
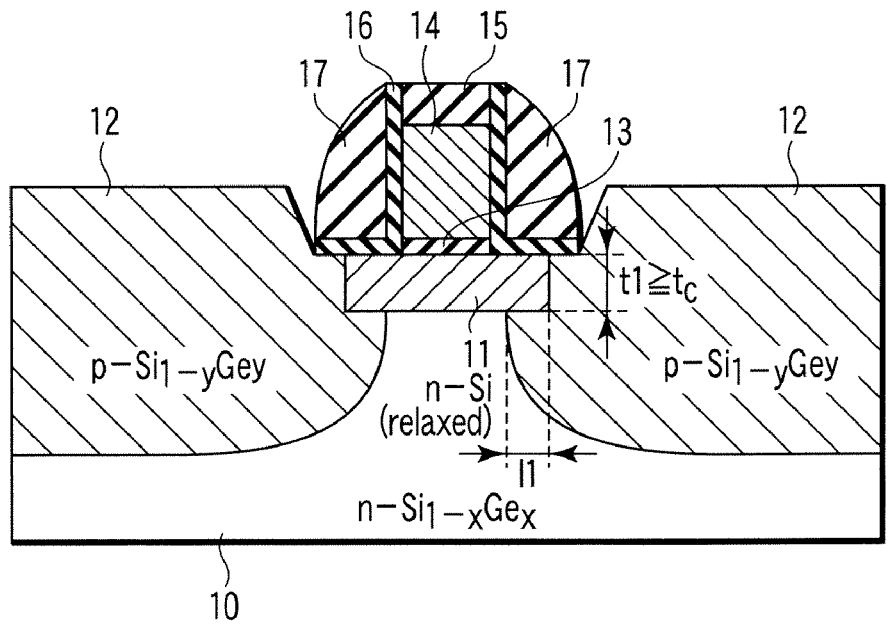
FIG. 1 is a cross-sectional view of a MOS transistor according to a first embodiment of the present invention.

A semiconductor device according to a first embodiment of the present invention and a method for fabricating the semiconductor device will now be described with reference to FIG. 1. FIG. 1 is a cross-sectional view of a p-channel MOS transistor according to this embodiment.

As shown in FIG. 1, an n-type Si layer 11 is formed on an n-type $Si_{1-x}Ge_x$ (x=a positive number less than 1) layer 10. A film thickness t1 of the Si layer 11 is not less than a critical thickness tc relative to the $Si_{1-x}Ge_x$ layer 10. The critical thickness, in this context, is such a film thickness that if the film thickness of the Si layer 11 is set at tc or more, no strain occurs due to a lattice mismatching with an underlayer of the Si layer 11 (i.e. strain is relaxed). In other words, if the film thickness of the Si layer 11 is set at less than tc, strain occurs due to the influence of the underlayer. The thickness of the Si layer 11 according to the present embodiment is set at the critical film thickness tc or more. Thus, the strain in the Si layer 11 due to lattice mismatching with the $Si_{1-x}Ge_x$ layer 10 is relaxed. The Si layer 11 has a lattice constant inherent to Si (hereinafter this kind of Si layer is also referred to as "unstrained Si layer"). In addition, p-type $Si_{1-y}Ge_y$ (y=a positive number less than 1) layers 12 are formed spaced apart in surface portions of the $Si_{1-x}Ge_x$ layer 10 so as to sandwich the Si layer 11. Parts of the p-type $Si_{1-y}Ge_y$ layers 12 function as a source and a drain of the MOS transistor. In the description below, when the composition ratio of Ge is not in question, $Si_{1-x}Ge_x$ and $Si_{1-y}Ge_y$ may simply be referred to as SiGe. Each SiGe layer 12 is formed such that a bottom portion thereof is deeper than the Si layer 11. Parts of the SiGe layers 12 are formed also right beneath the Si layer 11. Specifically, as shown in FIG. 1, a portion of each SiGe layer 12 extends underneath the Si layer 11 by a length l1 from an end portion of the Si layer 11.

A gate electrode 14 and an insulation film 15 are formed on the Si layer 11 with a gate insulation film 13 interposed between the gate electrode 14 and the Si layer 11. Insulation films 16 are formed on the side surfaces of the gate electrode 14, and side wall insulation films 17 are further formed on the insulation films 16. The insulation films 16 and 17 may be formed of the same material, and the insulation films 17 alone may be formed.

Next, a method for fabricating the MOS transistor with the above-described structure will be described with reference to FIG. 2 to FIG. 8. FIG. 2 and FIGS. 5 to 8 are cross-sectional views illustrating, in succession, fabrication steps of the MOS transistor according to the present embodiment. FIG. 3 is a schematic view of a interface between Si and SiGe, and FIG. 4 is a graph showing a critical film thickness tc at which a strain is not relaxed when Si is epitaxially grown on SiGe.

Figure 2:
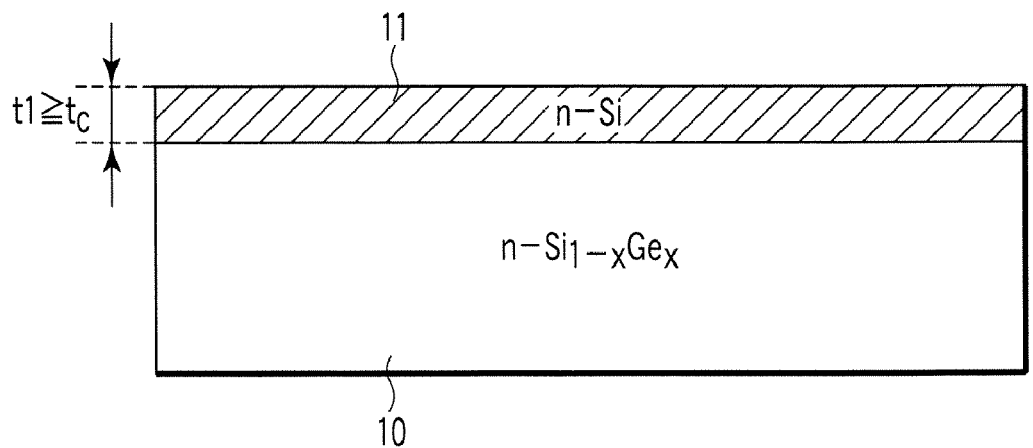
FIG. 2 is a cross-sectional view illustrating a first fabrication step of the MOS transistor according to the first embodiment of the invention.
Figure 3:
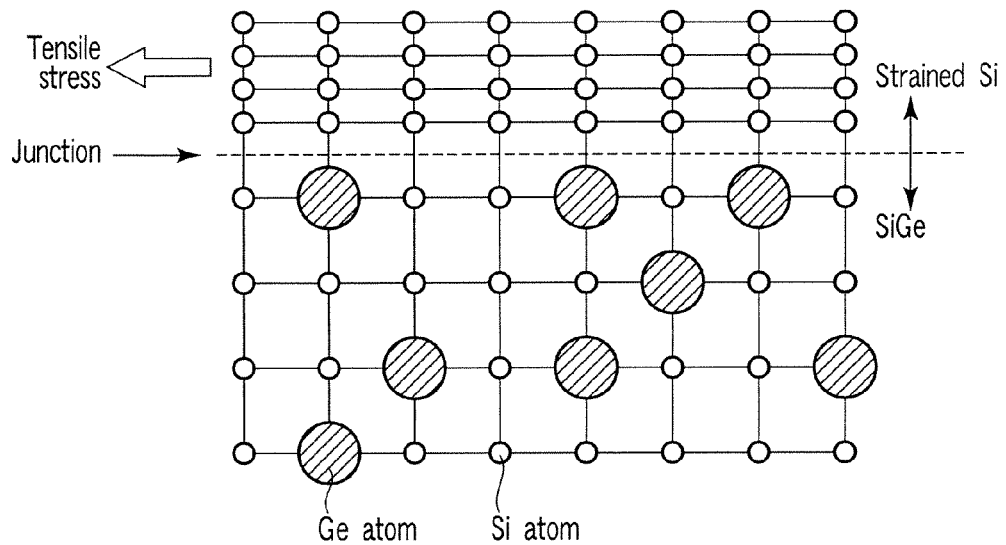
FIG. 3 is a schematic view showing an arrangement of atoms at a junction part between an SiGe layer and a strained Si layer.

To start with, as shown in FIG. 2, an n-type Si layer 11 is epitaxially grown on an $Si_{1-x}Ge_x$ layer 10 by, e.g. CVD. The film thickness t1 of the Si layer 11 is a critical thickness tc or more. The critical thickness tc is explained with reference to FIG. 3 and FIG. 4. In FIG. 3, circles indicate Si atoms, and circles with hatching indicate Ge atoms. As shown in FIG. 3, in a case where an Si layer is epitaxially grown on an SiGe layer, the Si layer is completely strained if the film thickness of the Si layer is less than a predetermined value (strained Si layer). As a result, a tensile stress is introduced to the Si layer on the SiGe layer in a direction parallel to the interface. The lattice constant of the Si layer is substantially equal to the lattice constant a1 of the SiGe layer. This predetermined value is the critical thickness tc.

Figure 4:
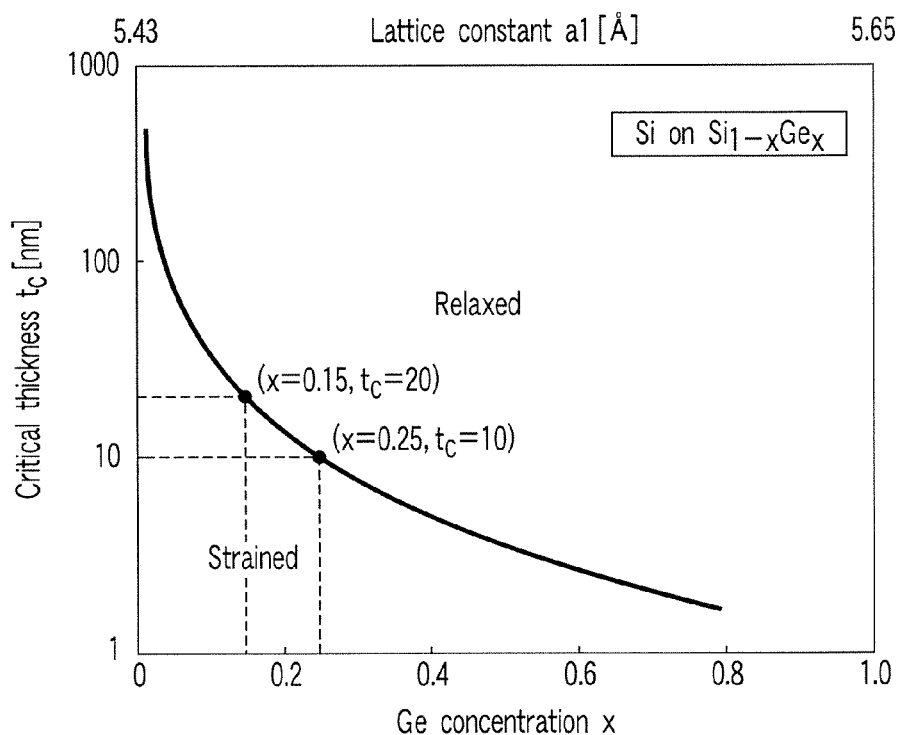
FIG. 4 is a graph showing a relationship between a Ge concentration, a lattice constant of SiGe, and a critical thickness of Si on SiGe.

As shown in the graph of FIG. 4, the critical thickness tc of the Si layer varies depending on the Ge concentration x in the underlying SiGe layer. As the Ge concentration x increases, the critical thickness tc becomes smaller. For example, the critical thickness tc of the Si layer in the case where x=0.15 is about 20 nm, and the critical thickness tc of the Si layer in the case where x=0.25 is about 10 nm. As the Ge concentration x increases, the lattice constant of the strained Si layer becomes closer to the lattice constant (5.65 Å) of Ge from the lattice constant (5.43 Å) of Si.

In the present embodiment, the Ge concentration x of the SiGe layer 10 is set at, e.g. 0.2, and the thickness of the Si layer 11 is set at, e.g. 30 to 50 nm, which is greater than the critical thickness tc. As a result, the Si layer 11 becomes an unstrained Si layer, and the lattice constant a2 of the Si layer 11 is set at a value inherent to Si, which is less than the lattice constant a1 of the SiGe layer 10. Thus, the Si layer 11 is in the condition in which no tensile stress due to lattice mismatch with the SiGe layer 10 is induced.

Figure 5:
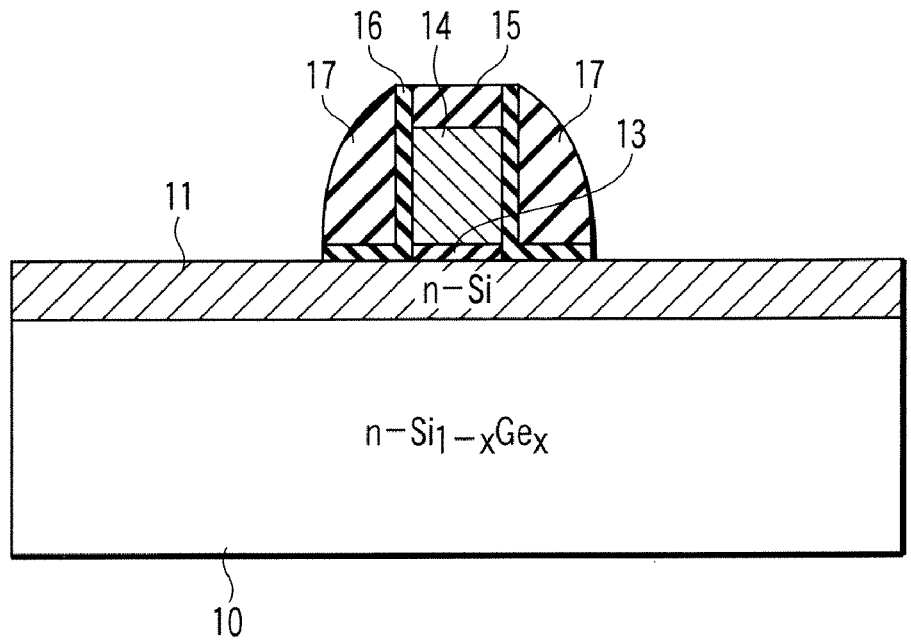
FIG. 5 is a cross-sectional view illustrating a second fabrication step of the MOS transistor according to the first embodiment of the invention.

In a subsequent fabrication step, as shown in FIG. 5, a gate electrode is formed on the Si layer 11. To begin with, a gate insulation film 13 is formed by a method of, for example, oxidizing the surface of the Si layer 11. Then, a polysilicon layer, a metal layer or the like is formed on the gate insulation film 13, and further an insulation film 15, such as a silicon nitride film, is formed. These films are patterned by using photolithography and anisotropic etching such as RIE, thus forming a gate electrode 14 and a hard mask 15. Further, insulation films 16 and 17 are formed on the side walls of the gate electrode 14 and hard mask 15, and side wall insulation films 16 and 17, as shown in the Figures, are formed by using photolithography, RIE and CDE (Chemical Dry Etching). As mentioned above, the insulation films 17 alone may be provided.

Figure 6:
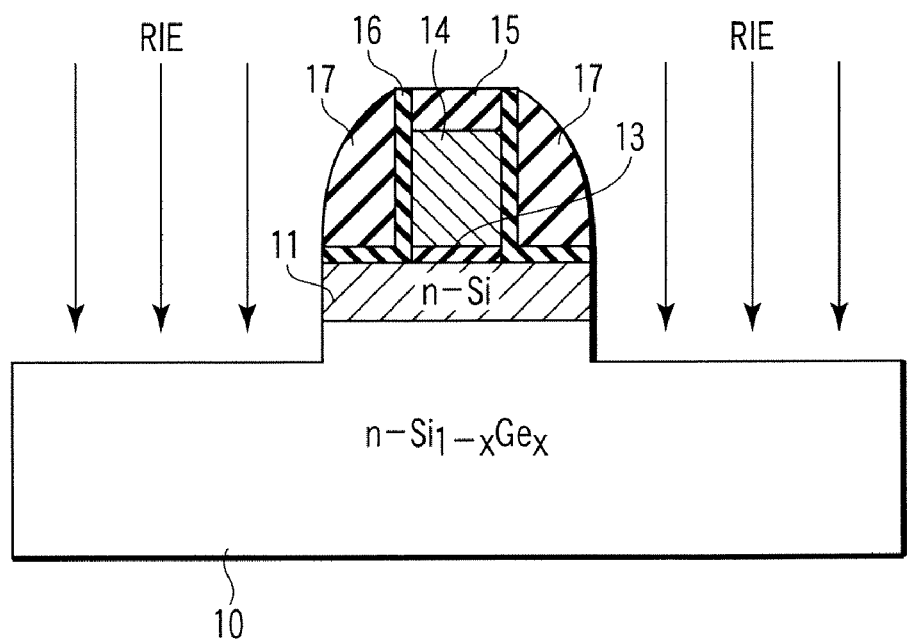
FIG. 6 is a cross-sectional view illustrating a third fabrication step of the MOS transistor according to the first embodiment of the invention.

Subsequently, as shown in FIG. 6, those portions of the Si layer 11, which correspond to the source/drain regions of the MOS transistor, are recessed by, e.g. RIE using the hard mask 15 and side wall insulation films 16 and 17 as masks. In this case, the etching is performed so that all the Si layer 11 in the source/drain regions may be completely etched away, while the hard mask 15 may be still intact.

Figure 7:
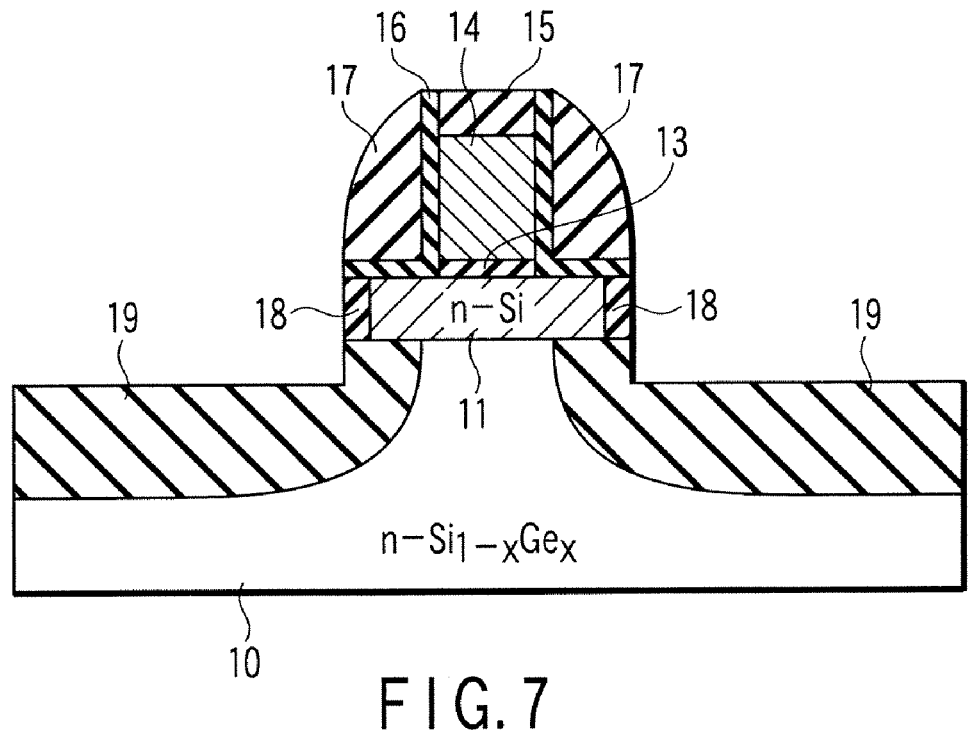
FIG. 7 is a cross-sectional view illustrating a fourth fabrication step of the MOS transistor according to the first embodiment of the invention.

Next, the surfaces of the Si layer 11 and SiGe layer 10, which are exposed by the etching illustrated in FIG. 6, are oxidized. The oxidization is performed under the condition that the oxidation rate of the SiGe layer 10 is higher than the oxidation rate of the Si layer 11. An example of such a condition is an atmosphere containing water vapor and 5% hydrochloric acid at 750° C. Under this condition, the SiGe layer 10 is oxidized at a rate that is several tens of times higher than the oxidation rate of the Si layer 11. As a result, as shown in FIG. 7, $SiO_2$ films 18 are formed on surfaces of the Si layer 11, and SiGe oxidation surfaces 19 are formed on the surface of the SiGe layer 10. Needless to say, the thickness of the SiGe oxide film 19 becomes greater than that of the $SiO_2$ film 18 in accordance with the difference in oxidation rate.

Figure 8:
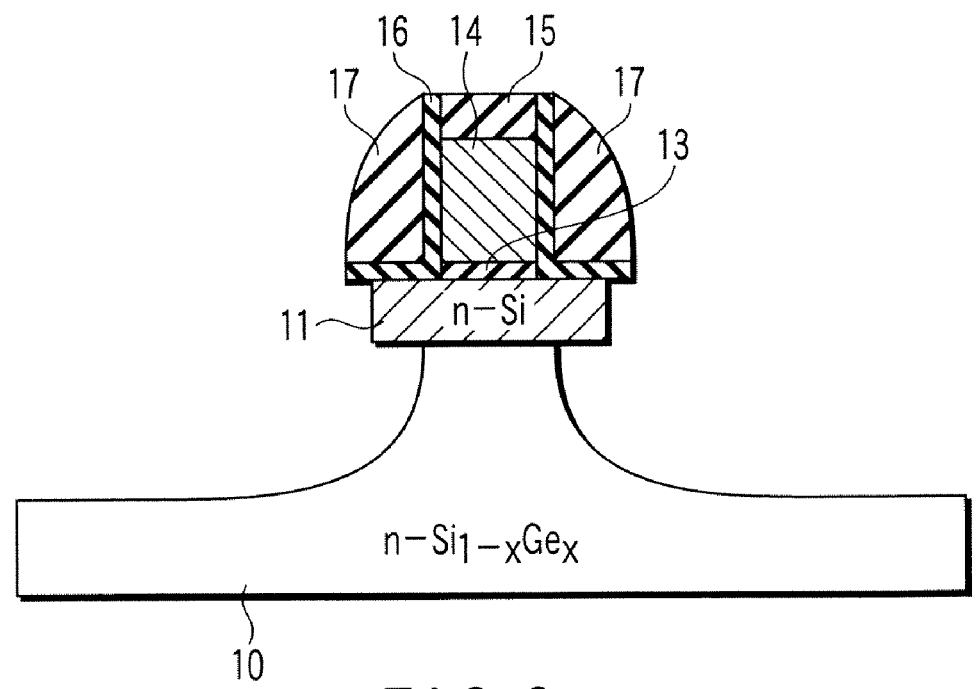
FIG. 8 is a cross-sectional view illustrating a fifth fabrication step of the MOS transistor according to the first embodiment of the invention.

By performing a wet process using a hydrofluoric acid-based solution, the oxide films 18 and 19, which are formed in the step of FIG. 7, are removed. This wet process is performed under such a condition that the hard mask 15 is not vulnerable to the solution. In other words, in the step illustrated in FIG. 5, the hard mask 15 is made up of a material which can not be dissolved by the solution that is used in the present step for removing the oxide films 18 and 19. As a result, as shown in FIG. 8, the oxide films 18 and 19 are removed and the surfaces of the Si layer 11 and SiGe layer 10 are exposed.

Subsequently, a p-type SiGe layer 12 having a greater lattice constant than the Si layer 11 is epitaxially grown, and the source and drain of the MOS transistor shown in FIG. 1 are formed. Thereby, a compressive stress in a direction along the channel can be introduced to the channel region. Since the SiGe layer is grown only on Si and SiGe, it is not formed on the gate electrode 14. Thus, the MOS transistor shown in FIG. 1 is completed.

The following advantageous effects (1) and (2) can be obtained by the above-described semiconductor device according to the first embodiment of the invention and the method for fabricating the semiconductor device.

(1) A compressive stress can effectively be introduced to the channel of the p-channel MOS transistor, and the performance of the MOS transistor can be enhanced.

In the structure and method of this embodiment, the source/drain regions are mainly recessed by the oxidation and wet process. While the hard mask 15 is prevented from being stripped away, the recessed depth in source and drain region can be great, and the compressive stress can effectively be introduced to the channel. This advantageous effect is explained below in detail.

Figure 9:
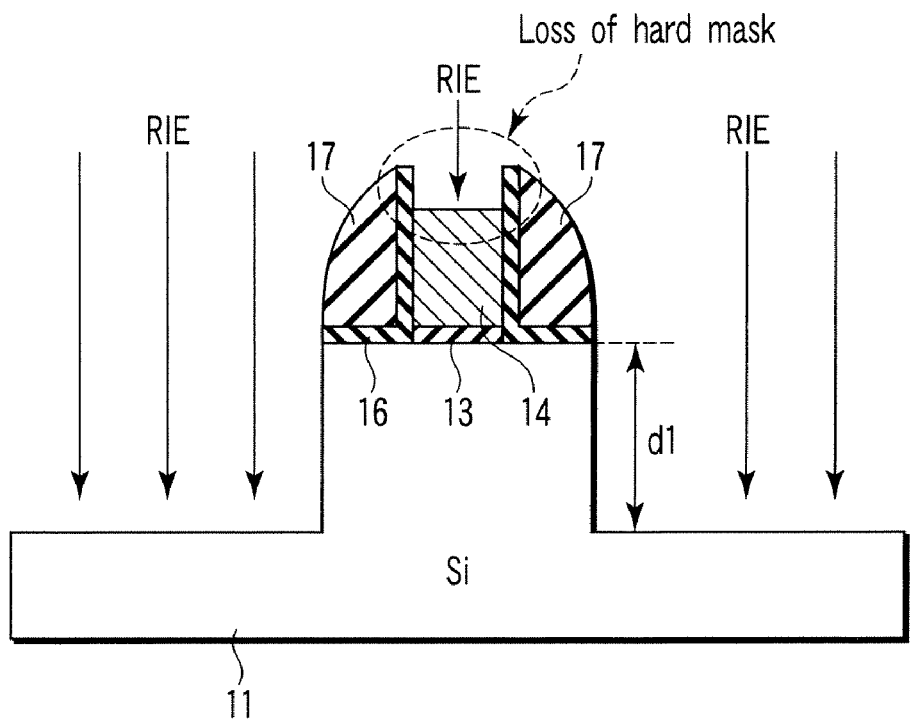
FIG. 9 is a cross-sectional view illustrating a fabrication step of a conventional MOS transistor.

FIG. 9 is a cross-sectional view illustrating a process of recessing source/drain regions by a conventional method. As shown in FIG. 9, in this conventional structure, the SiGe layer 10 in the structure of FIG. 5 of the present embodiment is replaced with an Si layer 11. In usual cases, the Si layer 11 in the source/drain regions is recessed by an etching process using RIE and CDE. If the recessed depth in source and drain region is to be sufficiently deep, the RIE has to be performed for a long time. However, if the RIE is performed for a long time, there would be a case in which the hard mask 15 is also etched and the surface of the gate electrode 14 is exposed. If the surface of the gate electrode 14 is exposed, the SiGe layer 12 would be formed also on the gate electrode 14 when the SiGe layer 12 is epitaxially grown later, causing an electrical short between neighboring MOS transistors via gate electrodes 14 which SiGe are unintentionally grown, or between source/drain and gate electrodes 14. Thus, the RIE cannot excessively be performed, and the depth d1 of the source and drain can hardly be increased.

Figure 10:
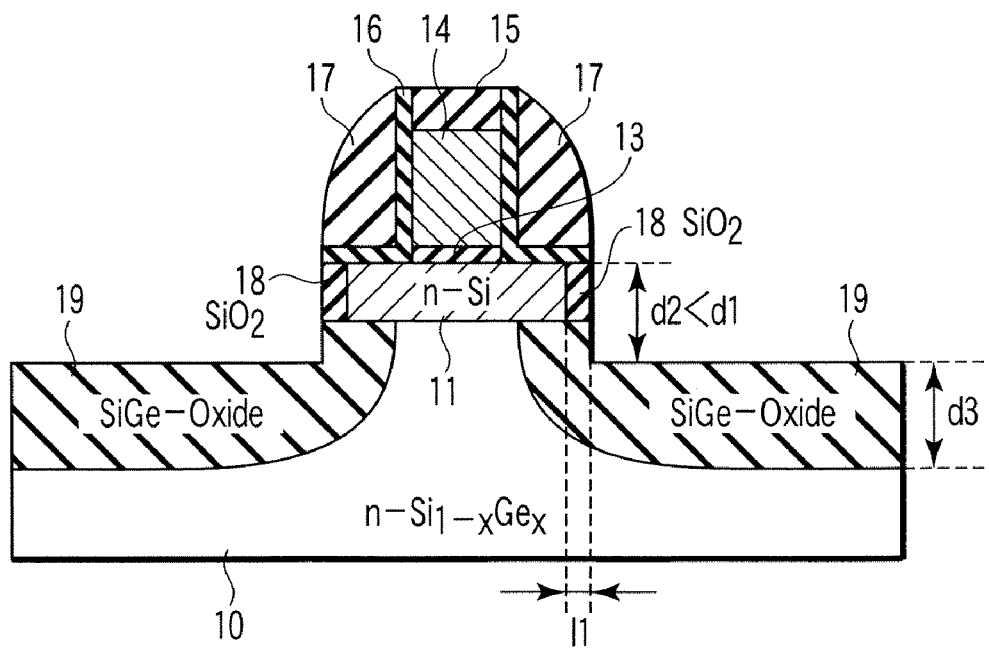
FIG. 10 is a cross-sectional view illustrating a fabrication step of the MOS transistor according to the first embodiment of the invention.

However, according to the method of this embodiment, as described with reference to FIG. 6 and FIG. 7, the source/drain regions are recessed in the following manner. To begin with, using the hard mask 15, RIE is performed until the SiGe layer 10 is exposed. Then, the surface of the SiGe layer 10 is oxidized by an oxidation process. Subsequently, the formed oxide film is removed by a wet process. FIG. 10 is a cross-sectional view showing the structure after the oxidation is completed.

Figure 11:
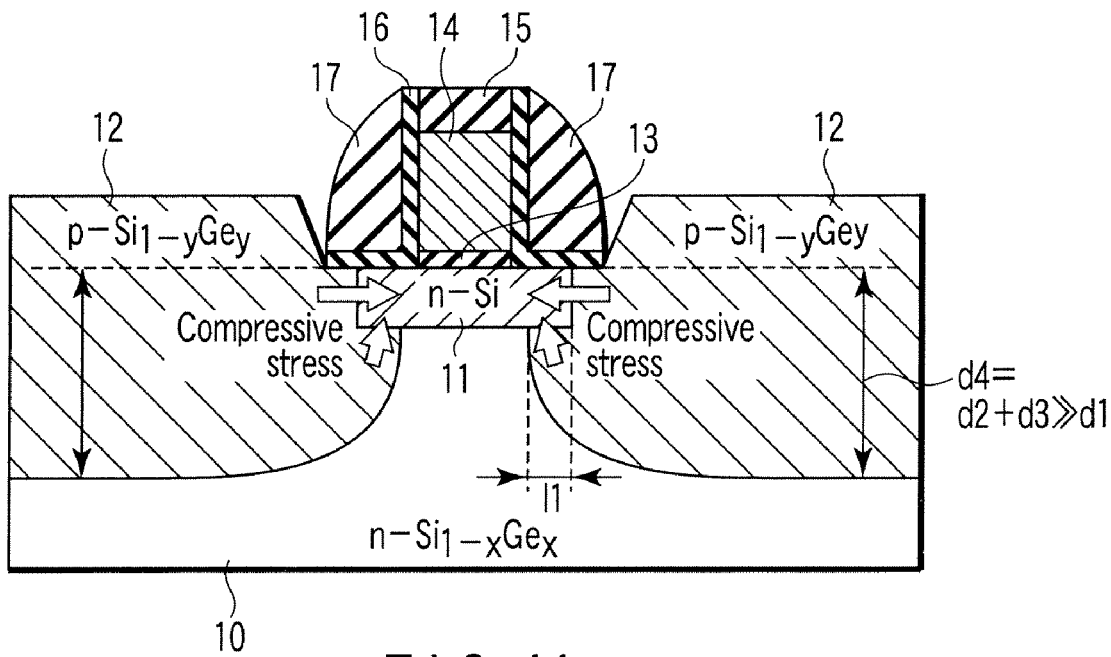
FIG. 11 is a cross-sectional view of the MOS transistor according to the first embodiment of the invention.

According to this method, it should suffice if the etching by RIE is performed to such a degree that the thin Si layer 11 is completely etched away. The depth d2 of etching is much less than the depth d1 of RIE in the method described with reference to FIG. 9. Subsequently, the recessing is carried out by oxidation and removing. Since the DRY etching technique is not used in this fabrication step, the hard mask 15 on the gate electrode 14 is not removed. Thus, the oxide film 19, which is formed on the SiGe layer 10 by the oxidation process, can be formed to have a sufficient depth (depth d3) from the surface of the SiGe layer 10. Thus, as shown in FIG. 11, the depth d4 (=d2+d3) of the source/drain from the surface of the Si layer 11 can be made greater than in the prior art with less hard mask erosion. FIG. 11 is a cross-sectional view of the MOS transistor according to the present embodiment. As shown in FIG. 11, since the depth d4 of the source/drain is sufficiently large, a compressive stress in a direction parallel to the electric current flow, can effectively be introduced to the Si layer 11 which becomes the channel of the MOS transistor. As a result, the hole mobility can be increased, and the performance of the MOS transistor can be enhanced.

The above-described method can prevent the hard mask 15 from being stripped away. Therefore, when the SiGe layer 12 is epitaxially grown, electrical short between neighboring MOS transistors and between source/drain and gate electrode can be prevented.

The oxidation step of the SiGe layer 10 and Si layer 11 is performed under the condition that the oxidation rate of the SiGe layer 10 is higher than the oxidation rate of the Si layer 11. In other words, the semiconductor layers 10 and 11 are formed by using materials that can meet this condition. Thereby, while the oxide films 19 are formed deep into the SiGe layer 10, the Si layer 11 is slightly oxidized.

Besides, with the structure according to the present embodiment, as shown in FIG. 11, the SiGe layer 12, which has a lattice constant larger than that of silicon and acts as a stressor to the Si layer 11, are also present beneath the Si layer 11. The reason is that the SiGe layer 10 is also laterally oxidized (distance 11). With this structure, the Si layer 11 can receive compressive stress by the SiGe layer 12 in this region.

(2) A junction leakage current can be suppressed and the performance of the MOS transistor can be enhanced.

In the MOS transistor, one of factors of leakage current between the source/drain and the well region is a misfit dislocation arised from a difference in lattice constant between the source/drain and the well region. For example, in the structure shown in FIG. 9, if the Ge concentration of the SiGe layer that becomes the source/drain region is 20 atomic %, the lattice mismatch is about 0.8%. As a result, the misfit dislocation density is high and there is a case where junction leakage current becomes a serious problem.

In the present embodiment, however, both the well region (SiGe layer 10) and the source/drain region (SiGe layer 12)

contain SiGe, and the lattice mismatch can be reduced. Accordingly, a defect at the interface between the well region and the source/drain region can be reduced, and the junction leakage current can be decreased.

The lattice constant of the unstrained Si layer 11 is less than the lattice constant of the SiGe layer 12 regardless of the Ge concentration. Thus, the Ge concentration y of the SiGe layer 12 is not limited and may be higher or lower than, or equal to, the concentration x of the SiGe layer 10. However, from the standpoint of performance, it is preferable that x<y. From the standpoint of junction leakage current, it is preferable that x=y, at which the mismatch is not existed.

Figure 12:
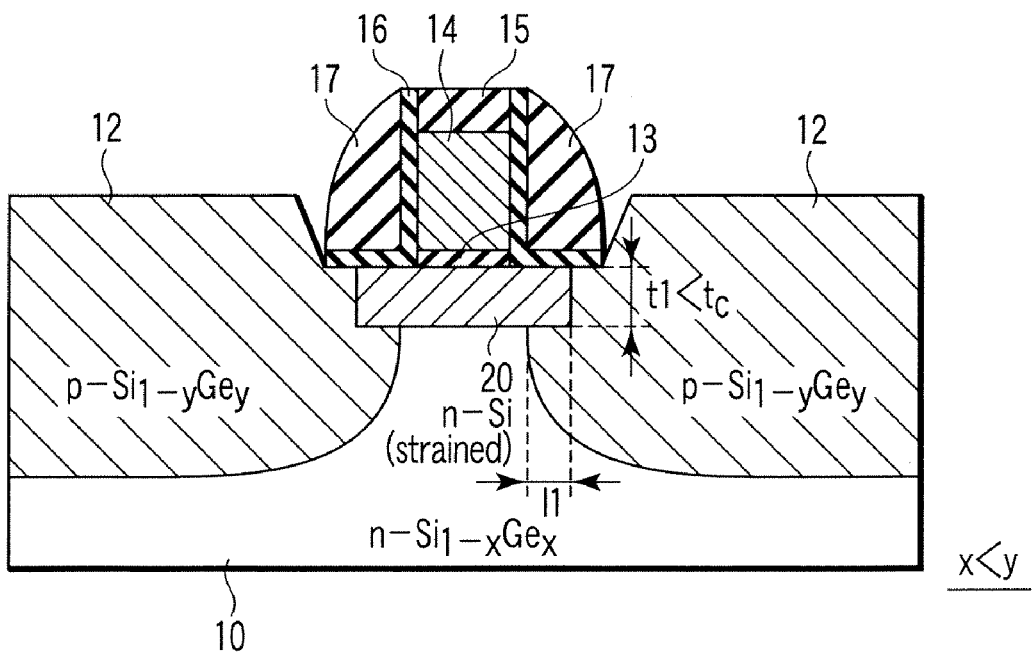
FIG. 12 is a cross-sectional view of a MOS transistor according to a second embodiment of the invention.

Next, a semiconductor device according to a second embodiment of the invention and a method for fabricating the semiconductor device are described. In the second embodiment, the Si layer 11 in the first embodiment is formed of strained silicon. FIG. 12 is a cross-sectional view of a MOS transistor according to the second embodiment.

As shown in FIG. 12, the p-channel MOS transistor according to the present embodiment is configured such that the n-type Si layer 11 in the structure shown in FIG. 1 according to the first embodiment is replaced with an n-type Si layer 20 having a thickness t1 that is less than the critical thickness tc (hereinafter this kind of Si layer may also be referred to as "strained Si layer"). In addition, the Ge concentration y of the SiGe layer 12 that becomes the source and drain is set to be higher than the Ge concentration x of the SiGe layer 10 (x<y). The fabrication method of the MOS transistor according to the present embodiment is the same as that in the first embodiment except that the thickness of the Si layer 11 in the first embodiment is set to be less than the critical thickness, so a description thereof is omitted here.

According to the structure of the present embodiment, too, the same advantageous effects (1) and (2) as in the first embodiment can be obtained. In the present embodiment, since the thickness of the Si layer 20 is less than the critical thickness, the Si layer 20 has a strain due to junction with the SiGe layer 10 and tensile stress is introduced. In other words, the Si layer 20 has substantially the same lattice constant as the SiGe layer 10. In the case of a p-channel MOS transistor, in order to further improve the hole mobility, it is necessary to induce a compressive stress in a uniaxial direction parallel to the channel. In the present embodiment, in order to make the lattice constant of the SiGe layer 12 greater than that of the Si layer 20, the Ge concentration y of the SiGe layer 12 is set to be higher than the Ge concentration x of the SiGe layer 10. Thereby, the SiGe layer 12 can induce to the Si layer 20 a compressive stress that is higher than a tensile stress from the SiGe layer 10.

With the structure according to the present embodiment, since the SiGe layers 10 and 12 have different lattice constants, the defect density at the junction parts of the source and drain increases, compared to the first embodiment. However, the SiGe layers 10 and 12 are formed of the same material with only their compositions being different, and the ratio of mismatch of lattices is reduced. Thus, the defect density is remarkably reduced, compared to the prior art.

Figure 13:
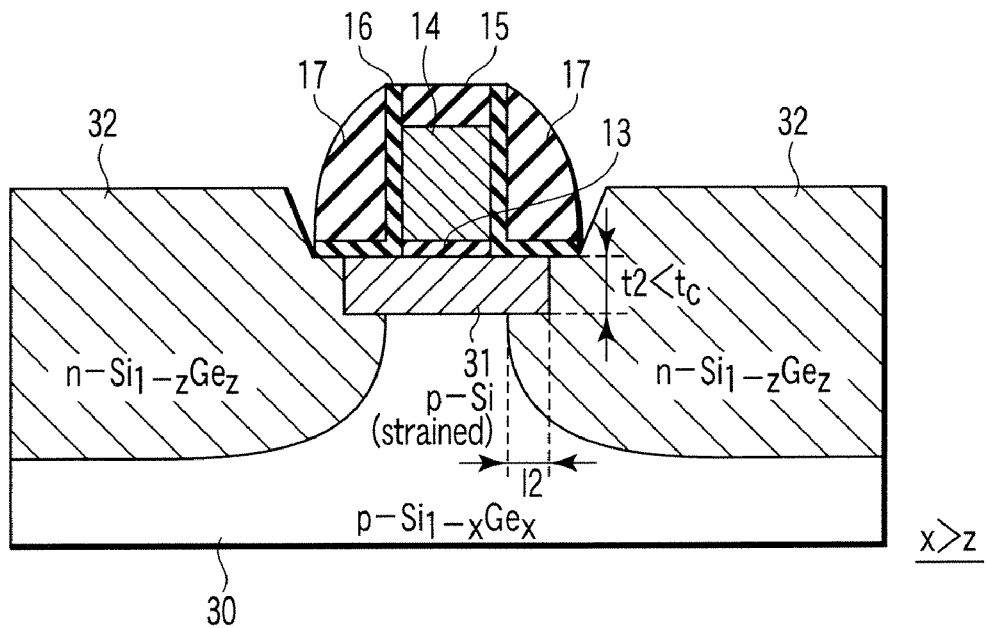
FIG. 13 is a cross-sectional view of a MOS transistor according to a third embodiment of the invention.

Next, a semiconductor device according to a third embodiment of the invention and a method for fabricating the semiconductor device are described. In the present embodiment, the first and second embodiments are applied to an n-channel MOS transistor. FIG. 13 is a cross-sectional view of an n-channel MOS transistor according to the present embodiment.

As shown in FIG. 13, a p-type Si layer 31 is formed on a p-type $Si_{1-x}Ge_x$ substrate 30. The thickness t2 of the Si layer 31 is less than a critical thickness tc at which a strain due to lattice matching with the p-type $Si_{1-x}Ge_x$ substrate 30 is not relaxed. Thus, the Si layer 31 is a strained silicon layer, which has a lattice constant equal to that of the SiGe layer 30. In addition, n-type $Si_{1-z}Ge_z$ layers 32 (x>z>=0) are formed spaced apart in surface portions of the $Si_{1-x}Ge_x$ layer 30 so as to sandwich the Si layer 31. Parts of the $Si_{1-z}Ge_z$ layers 32 function as a source and a drain of the MOS transistor. In the description below, when the composition ratio of Ge is not in question, $Si_{1-x}Ge_x$ and $Si_{1-z}Ge_z$ may simply be referred to as SiGe. Each SiGe layer 12 is formed such that a bottom portion thereof is deeper than the Si layer 31. Parts of the SiGe layers 32 are formed also beneath the Si layer 31. Specifically, as shown in FIG. 13, a portion of each SiGe layer 32 extends beneath the Si layer 31 by a length l2 from an end portion of the Si layer 31. A gate electrode 14 and an insulation film 15 are formed on the Si layer 31 with a gate insulation film 13 interposed between the gate electrode 14 and the Si layer 31. Insulation films 16 are formed on the side surfaces of the gate electrode 14, and side wall insulation films 17 are further formed on the insulation films 16. Needless to say, the insulation films 17 alone may be formed.

Specifically, the structure of the third embodiment is obtained by modifying the second embodiment such that the conductivity type of the SiGe layer 10 and Si layer 11 is changed from an n-type to a p-type, the conductivity type of the SiGe layer 12 is changed from a p-type to an n-type, and the Ge concentration is varied. The fabrication method in the third embodiment is the same as that in the first and second embodiment, so a description thereof is omitted here.

With the structure according to the present embodiment, the following advantageous effect (3) can be obtained in addition to the advantageous effect (2) which has been described in connection with the first embodiment.

(3) A tensile stress can effectively be introduced to the channel of the n-channel MOS transistor, and the performance of the MOS transistor can be enhanced.

The advantageous effect (3) is substantially the same as the advantageous effect (1) which has been described in connection with the first embodiment. Specifically, the source/drain regions are recessed not only by RIE, but also by oxidation and removing. Accordingly, as shown in a cross-sectional view of FIG. 14, the depth d5 of the source/drain can be increased, and a stress can effectively be introduced to the Si layer 31 in which the channel is formed.

In the case of the n-channel MOS transistor, unlike the p-channel MOS transistor, the characteristics of the MOS transistor can be improved by applying a tensile stress in a direction parallel to the channel. Thus, the lattice constant of the SiGe layer 32 needs to be made less than that of the Si layer 31. However, the lattice constant of silicon is less than that of germanium. Hence, if the unstrained Si layer is put in contact with the SiGe layer, a compressive stress is introduced to the Si layer. In the present embodiment, the thickness of the Si layer 31 is set to be less than the critical thickness tc, thereby making the lattice constant of the Si layer 31 substantially equal to that of the SiGe layer 30. Moreover, the Ge concentration z of the SiGe layer 32 is set to be lower than the Ge concentration x of the SiGe layer 30 (x>z). As a result, the lattice constant of the SiGe layer 32 becomes less than that of the Si layer 31, and a tensile stress can be introduced to the Si layer 31.

Figure 14:
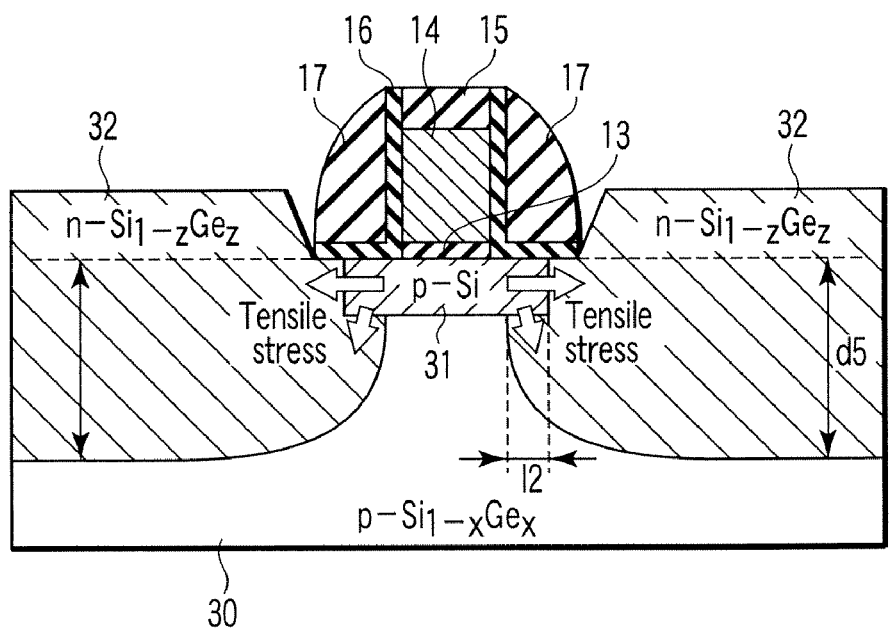
FIG. 14 is a cross-sectional view of a MOS transistor according to the third embodiment of the invention.

Furthermore, like the first embodiment, as shown in FIG. 14, a tensile stress can be introduced to the Si layer 31 from the SiGe layer 32 beneath the Si layer 31.

A tensile stress is also introduced to the Si layer 31 from the SiGe layer 30. Thus, the composition ratio of Ge may be set to be x<z, within such a range as not to apply a compressive stress which is so great as to cancel the tensile stress received from the SiGe layer 30.

Figure 15:
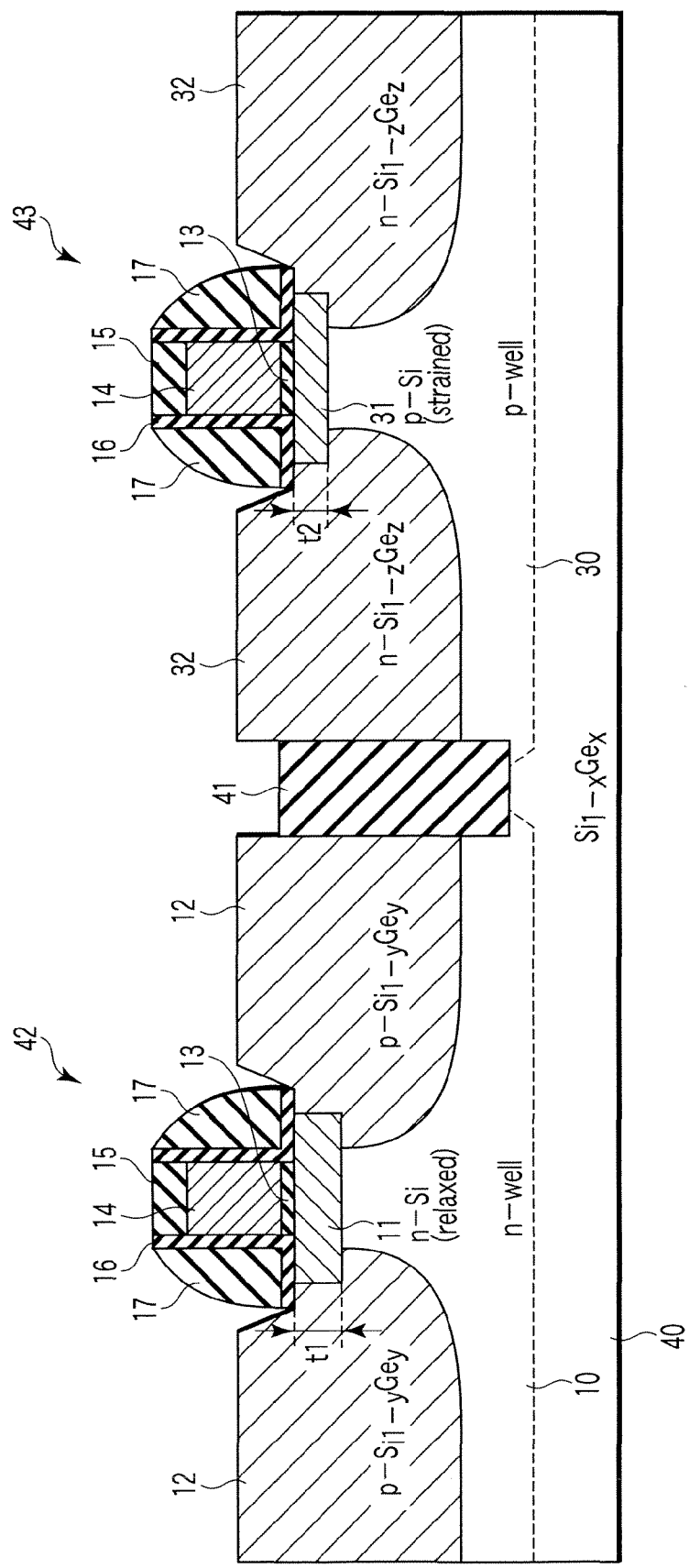
FIG. 15 is a cross-sectional view of a semiconductor device according to a fourth embodiment of the invention.

Next, a semiconductor device according to the fourth embodiment of the invention and a method for fabricating the semiconductor device will now be described. The fourth embodiment is configured such that the p-channel MOS transistor described in connection with the first embodiment and the n-channel MOS transistor described in connection with the third embodiment are formed on the same substrate. FIG. 15 is a cross-sectional view of a semiconductor device according to the present embodiment.

As shown in FIG. 15, an n-type well region 10 and a p-type well region 30 are formed in surface regions of an $Si_{1-x}Ge_x$ layer 40. The SiGe substrate 40 may be of n-type or p-type. The n-type well region 10 and p-type well region 30 are electrically isolated by an isolation region 41 which is formed in a surface region of the SiGe substrate 40. A p-channel MOS transistor 42 and an n-channel MOS transistor 43 are provided on the n-type well region 10 and p-type well region 30, respectively. The structures of the p-channel MOS transistor 42 and n-channel MOS transistor 43 are as described in connection with the first and third embodiments. Specifically, in the p-channel MOS transistor 42, the thickness t1 of the n-type Si layer 11 in which the channel is formed is set at the critical thickness tc or more. Accordingly, the Si layer 11 is an unstrained silicon layer. On the other hand, in the n-channel MOS transistor 43, the thickness t2 of the p-type Si layer 31 in which the channel is formed is set at less than the critical thickness tc. Accordingly, the Si layer 31 is a strained silicon layer, and its lattice constant is equal to the lattice constant of the SiGe substrate 40. That is, t1>t2. The Ge concentration y of the SiGe layer 12 may be higher or lower than, or substantially equal to, the concentration x of the SiGe layer substrate 40. On the other hand, the Ge concentration z of the n-type SiGe layer 32 is lower than the Ge concentration x of the SiGe substrate 40.

Figure 16:
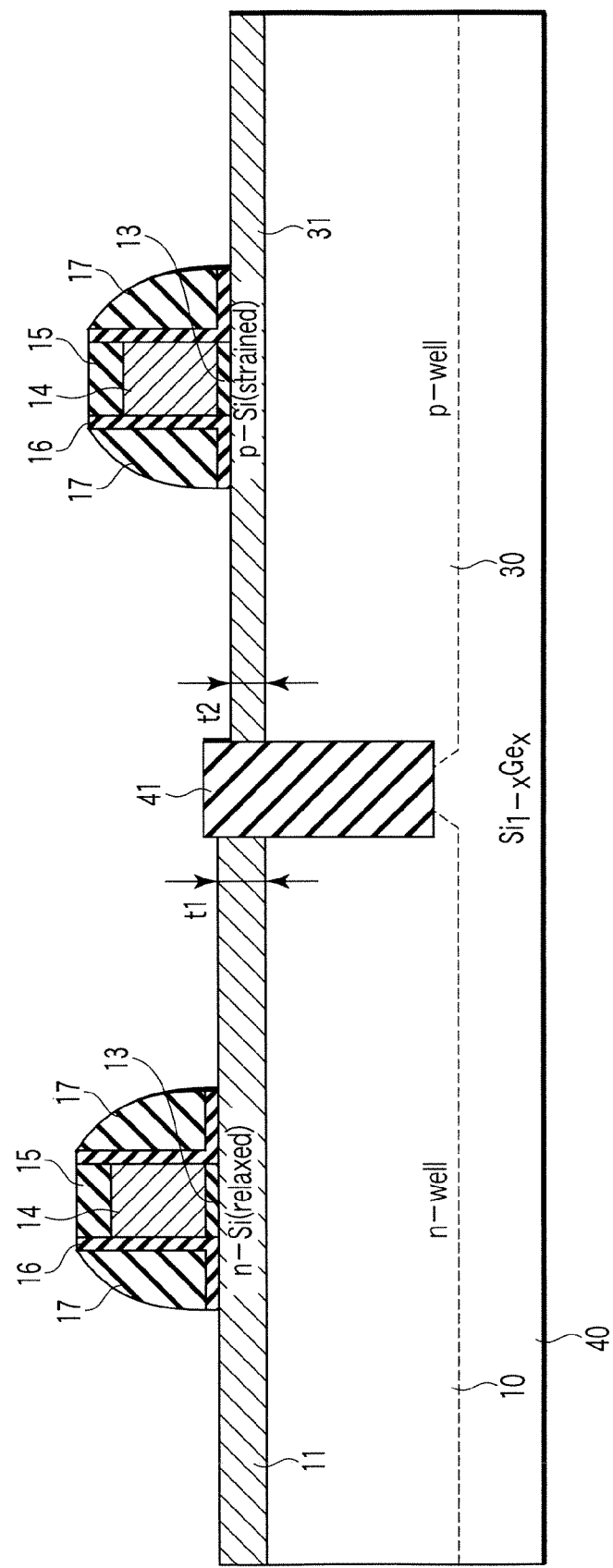
FIG. 16 is a cross-sectional view illustrating a first fabrication step of the semiconductor device according to the fourth embodiment of the invention.

Next, a method for fabricating the semiconductor device with the above-described structure is described with reference to FIG. 16 to FIG. 19. FIG. 16 to FIG. 19 are cross-sectional views illustrating, in succession, the fabrication steps of the semiconductor device according to this embodiment. To begin with, as shown in FIG. 16, n-type impurities and p-type impurities are doped by, e.g. ion implantation into the surface region of the SiGe substrate 40, thus forming an n-type well region 10 and a p-type well region 30. A isolation region 41 is formed by, e.g. an STI (Shallow Trench Isolation) technique, thereby to electrically isolate the n-type well region 10 and p-type well region 30. An n-type Si layer 11 with a thickness t1 (≧tc) and a p-type Si layer 31 with a thickness t2 (<tc) are epitaxially grown on the well regions 10 and 30 by, e.g. CVD. Subsequently, by the method which has been described in connection with the first embodiment, a gate electrode 14 and a hard mask 15 are formed on each of the Si layers 11 and 31 with a gate insulation film 13 interposed between the gate electrode 14 and the each of the Si layers 11 and 31. Further, insulation films 16, 17 are formed on side walls of the gate electrode 14. The insulation films 16 may not be provided.

Figure 17:
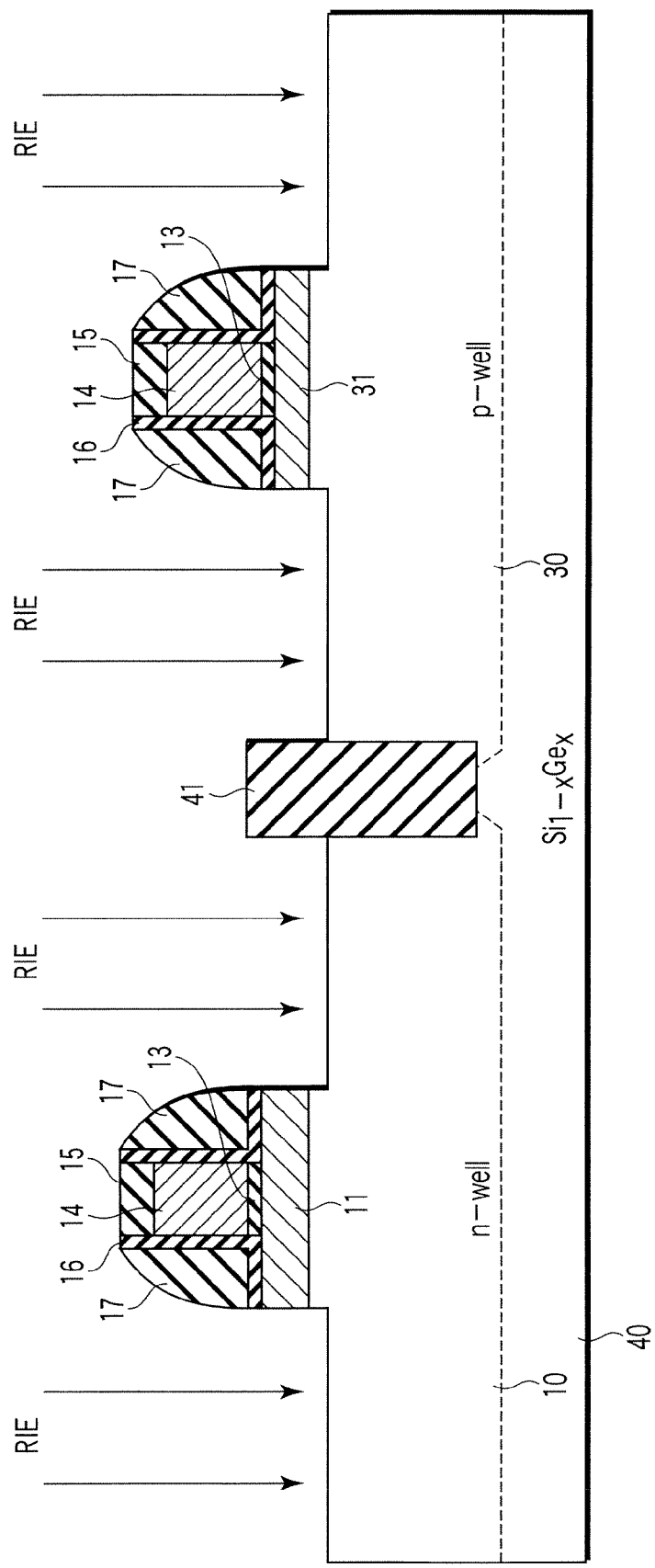
FIG. 17 is a cross-sectional view illustrating a second fabrication step of the semiconductor device according to the fourth embodiment of the invention.

Thereafter, as shown in FIG. 17, those portions of the Si layers 11 and 31, which correspond to the source/drain regions of the MOS transistors 42 and 43, are etched by, e.g. RIE using the hard masks 15 and side wall insulation films 16 and 17 as masks. In this case, the etching is performed to such a degree that all the Si layers 11, 31 in the source/drain regions may be removed and the hard masks 15 may not be etched away. The etching of the Si layer 11 and the etching of the Si layer 31 may be performed at the same time or in different steps.

Next, by the method which has been described in connection with the first embodiment, the surfaces of the Si layer 11, 31 and SiGe layer 10, 30, which are exposed by the etching illustrated in FIG. 17, are oxidized. As a result, as shown in FIG. 18, $SiO_2$ films 18, 38 are formed on surfaces of the Si layers 11, 31 and SiGe oxide films 19, 39 are formed on the surface of the SiGe layer 10, 30.

Figure 18:
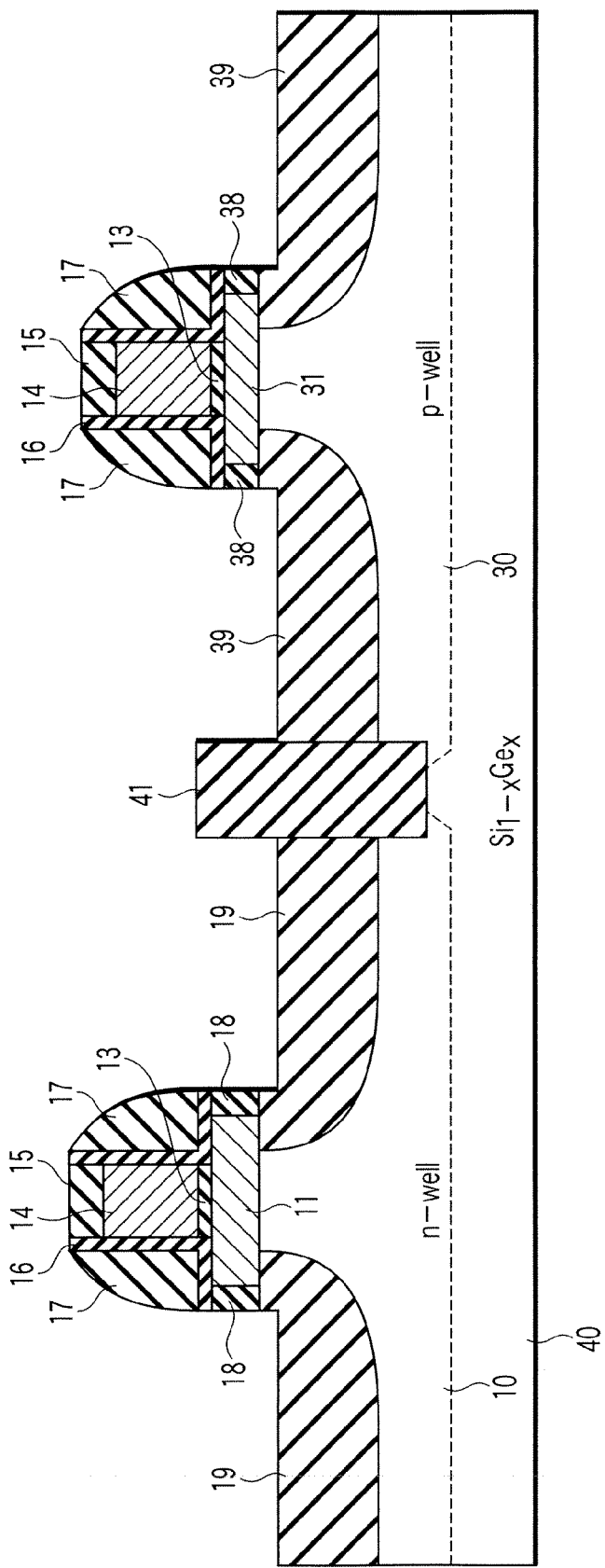
FIG. 18 is a cross-sectional view illustrating a third fabrication step of the semiconductor device according to the fourth embodiment of the invention.
Figure 19:
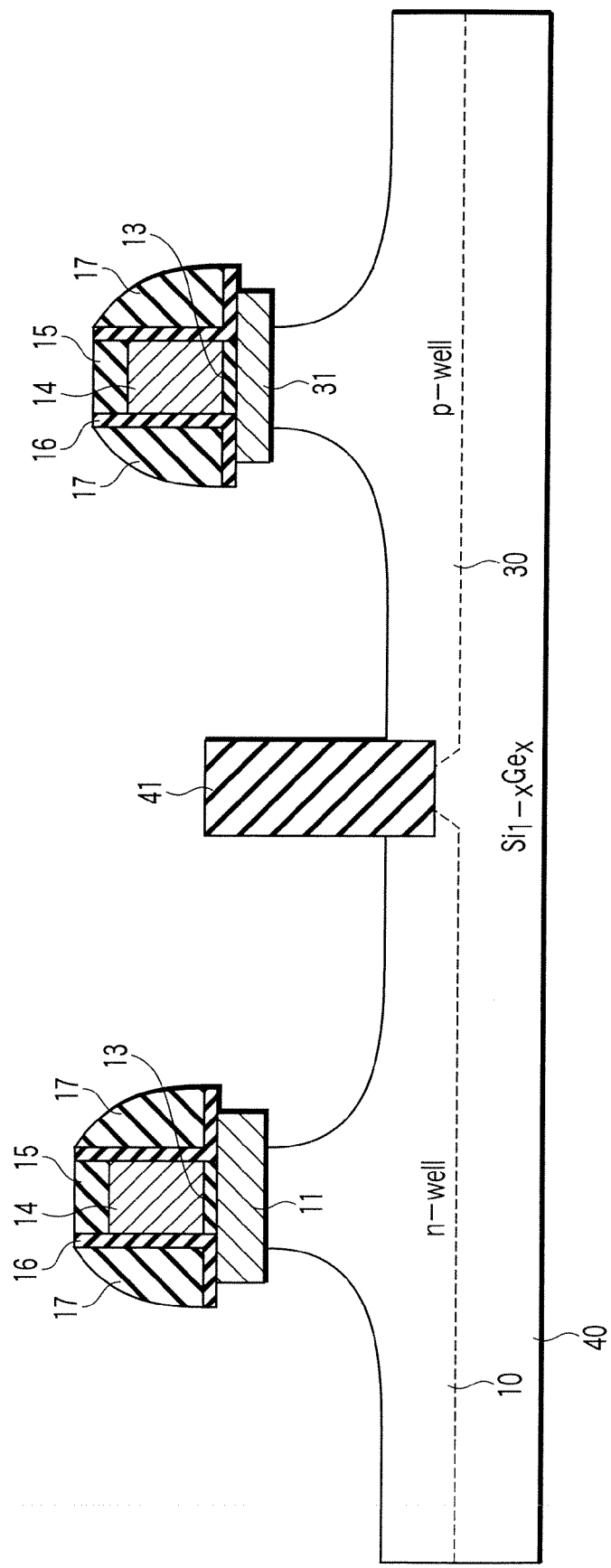
FIG. 19 is a cross-sectional view illustrating a fourth fabrication step of the semiconductor device according to the fourth embodiment of the invention.

Using the method described in connection with the first embodiment, a wet process using a hydrofluoric acid-based solution is performed and the oxide films 18, 19, 38 and 39, which are formed in the step of FIG. 18, are removed. The oxidation and removing step for the oxide films 18 and 19 and the oxidation and removing step for the oxide films 38 and 39 may be performed at the same time or in different steps. As a result, the surfaces of the Si layers 11, 31 and the surfaces of the SiGe layer 10, 30 are exposed.

Subsequently, a p-type SiGe layer 12 is epitaxially grown on the source/drain region of the p-channel MOS transistor 42 and an n-type SiGe layer 32 is epitaxially grown on the source/drain region of the n-channel MOS transistor 43. Thus, the p-channel MOS transistor 42 and n-channel MOS transistor 43 shown in FIG. 15 are completed.

Figure 20:
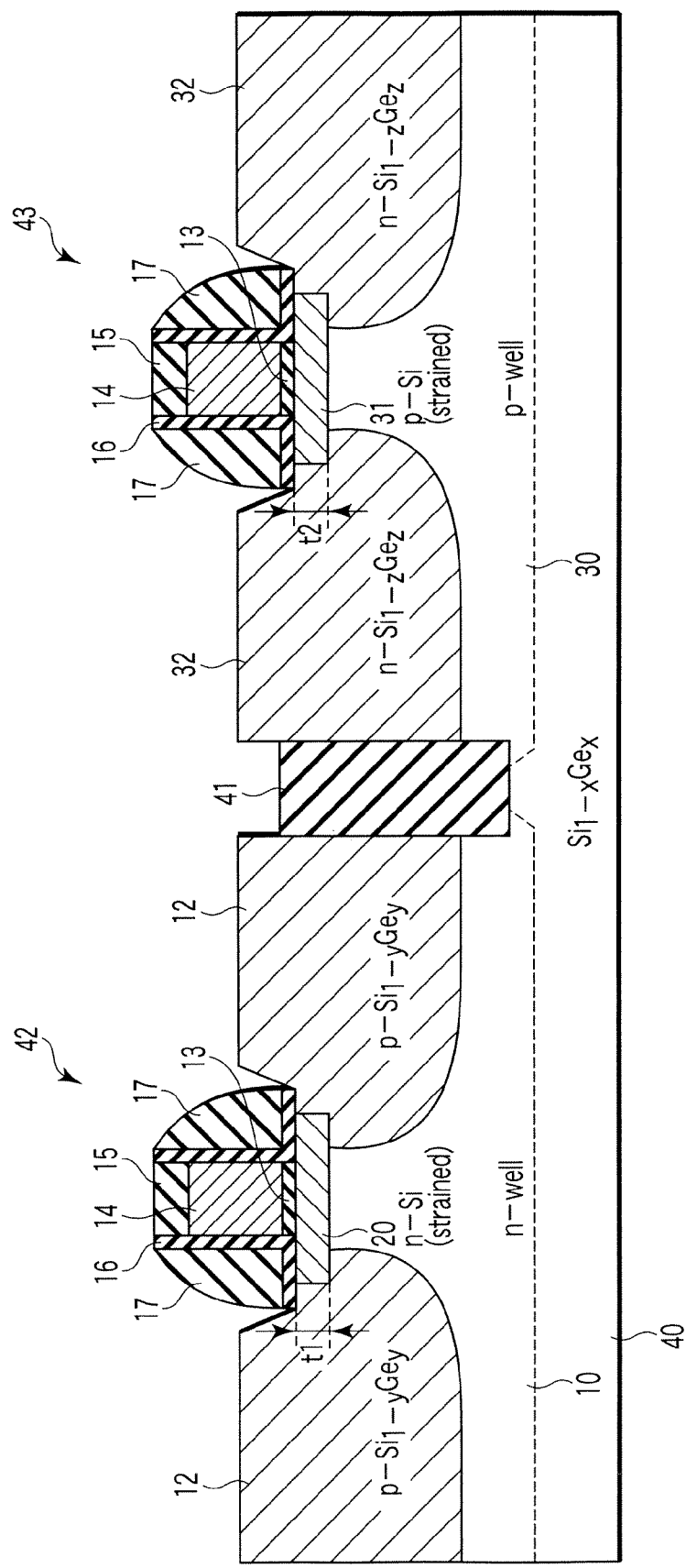
FIG. 20 is a cross-sectional view of a semiconductor device according to a modification of the fourth embodiment of the invention.

With the structure and fabrication method according to the present embodiment, the above-described advantageous effects (1) to (3) as described in connection with the first and third embodiments can be obtained by the n-channel MOS transistor and p-channel MOS transistor formed on the same semiconductor substrate. In this embodiment, the Si layer 11, in which the channel of the p-type MOS transistor 42 is formed, is the unstrained silicon layer. Alternatively, this Si layer 11 may be formed of strained silicon, as shown in FIG. 20. FIG. 20 is a cross-sectional view of a p-channel MOS transistor 42 and an n-channel MOS transistor 43. As shown in FIG. 20, the Si layer 11 in the structure depicted in FIG. 15 is replaced with a strained Si layer 20 having a thickness less than the critical thickness tc. In this case, it is possible to set t1=t2, and the Si layer 20 can be formed in the same step as the Si layer 31.

Figure 21:
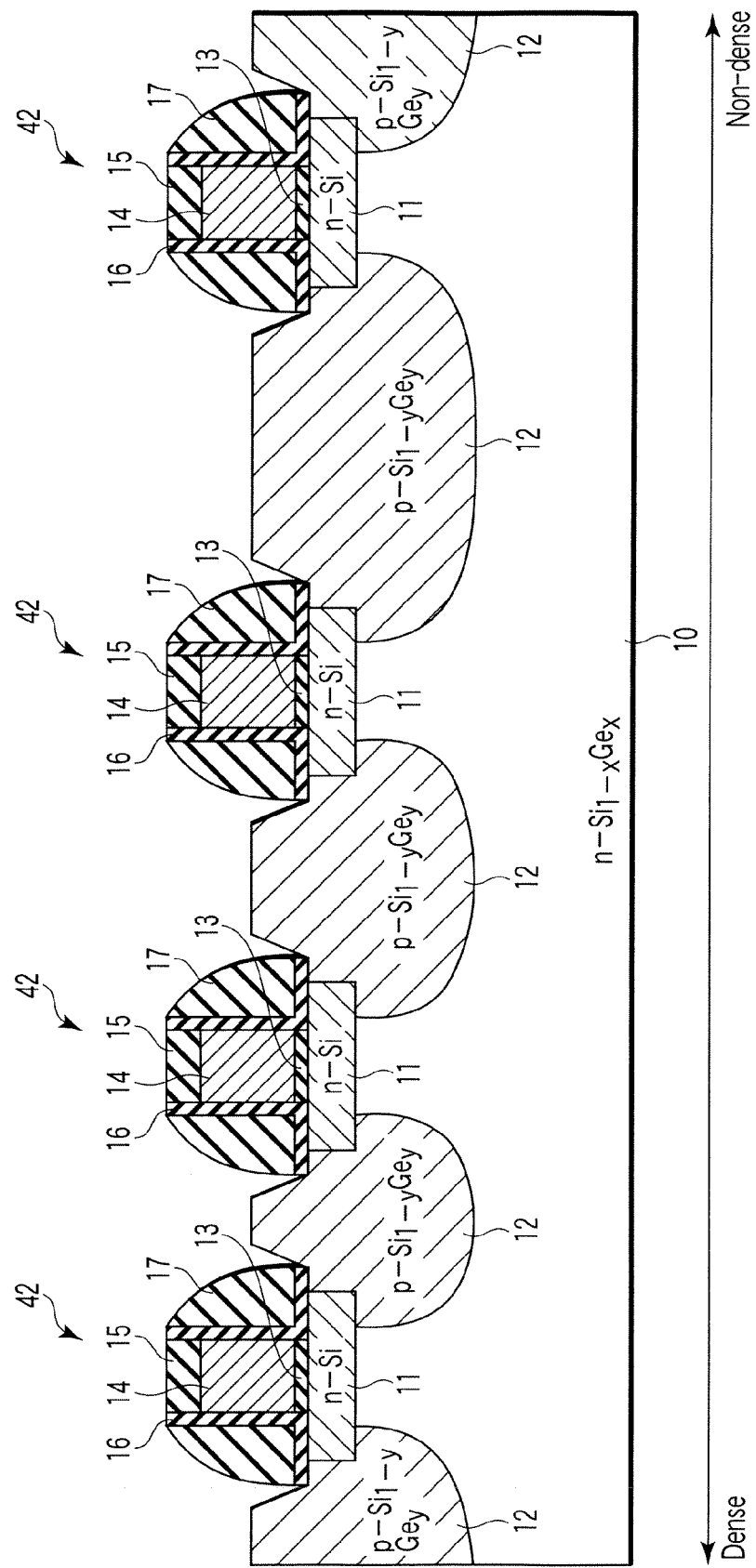
FIG. 21 is a cross-sectional view of a semiconductor device according to a fifth embodiment of the invention.

Next, a semiconductor device according to a fifth embodiment of the invention and a method for fabricating the semiconductor device are described. In the fifth embodiment, a plurality of MOS transistors according to the first to fourth embodiments are provided on the semiconductor substrate with different arrangement densities. FIG. 21 is a cross-sectional view of the semiconductor device according to the present embodiment.

As shown in FIG. 21, a plurality of p-channel MOS transistors 42 each having the structure described in connection with the first or second embodiment are formed on the n-type SiGe layer 10. The MOS transistors 42 are arranged with a higher density toward the left side on the sheet surface of FIG. 21, and with a lower density toward the right side. Needless to say, the p-channel MOS transistors 42 may be replaced with n-channel MOS transistors 43 as described in connection with the third embodiment. The fabrication method of this structure is as described in connection with the first embodiment. The step of forming the Si layer 11 and gate electrode 14, the step of epitaxially growing the SiGe layer 12, the step of removing the oxide film and the RIE step of the Si layer 11 and SiGe layer 10 can be performed at the same time with respect to the plural MOS transistors.

With the semiconductor device according to this embodiment, the following advantageous effect (4) can be obtained in addition to the advantageous effects (1) to (3) which have been described in connection with the first to third embodiments.

(4) Variability in characteristics of MOS transistors can be reduced and the performance of the semiconductor device can be improved.

In general, when a semiconductor or the like is etched, a shape which is obtained as a result of etching depends on a pattern shape to be etched. For example, when an etching pattern includes a dense region and a non-dense region, the depth of etching is small at the dense region and is large at the non-dense region. In the semiconductor device having the structure shown in FIG. 21, if the source/drain regions are recessed by RIE, the source/drain has a less depth at a region with a higher density and has a greater depth at a region with a lower density. Consequently, performance variability occurs between MOS transistors.

Figure 22:
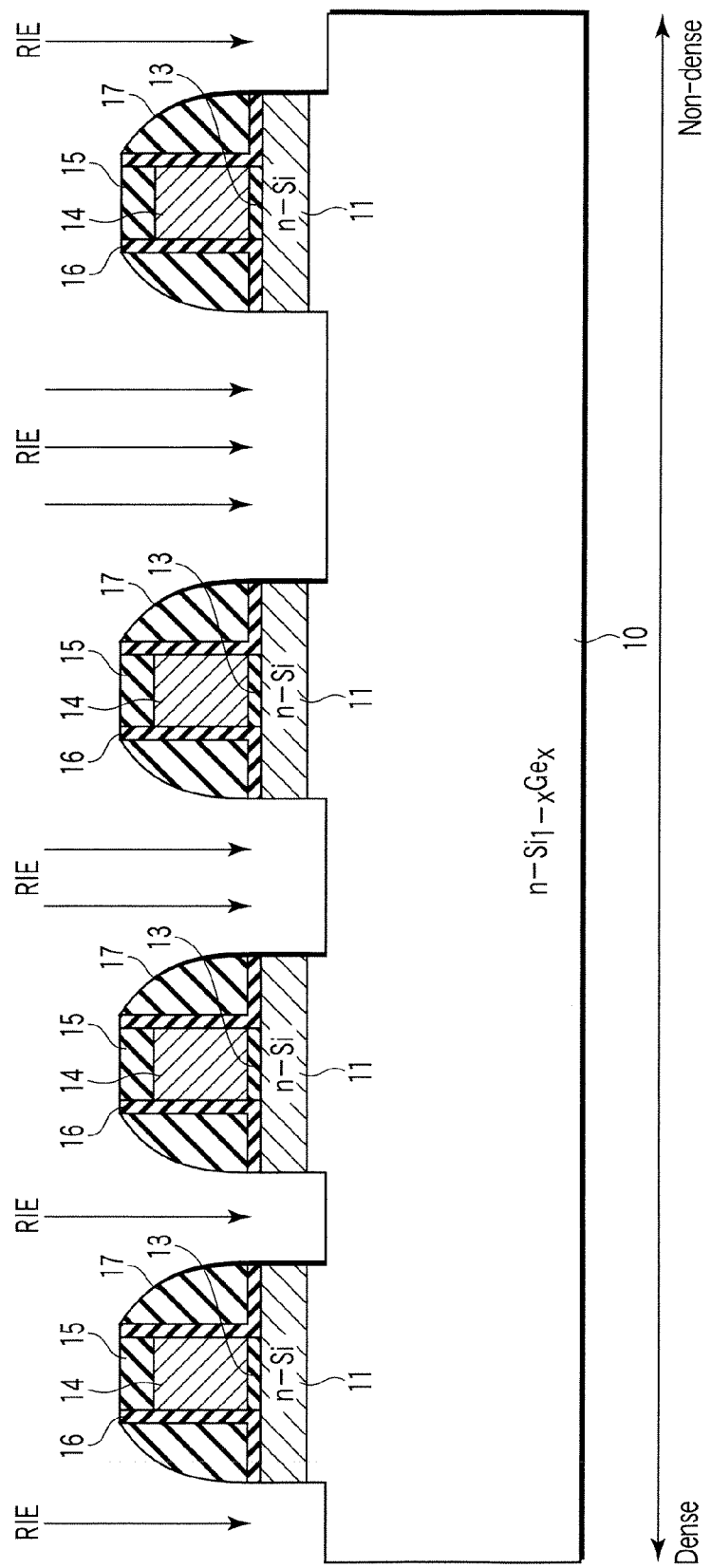
FIG. 22 is a cross-sectional view illustrating a fabrication step of the semiconductor device according to the fifth embodiment of the invention.

In the present embodiment, however, as described in connection with the first embodiment, the source/drain regions are recessed by RIE, oxidation and removing which are performed to such a degree that the Si layer 11 is removed. Accordingly, as shown in a cross-sectional view of FIG. 22 which illustrates an RIE step, the depth of etching in the RIE step may be less than in the prior art. The reason is that it should suffice if at least the Si layer 11 is removed. In the case where the depth of etching is shallow, non-uniformity in etching depth due to dense/non-dense regions may be small. In addition, the oxidation rate in the subsequent oxidation step is hardly affected by dense/non-dense regions. Thus, even in the case where MOS transistors are arranged with high and low densities, the depth of the SiGe layer 12 can substantially be made equal, and the performance variability of MOS transistors can be suppressed.

As has been described above, according to the semiconductor devices of the first to fifth embodiments of the invention and the fabrication methods thereof, in the MOS transistor in which the source/drain is formed by epitaxial growth of SiGe, the substrate (or well) and the surface region including the channel region are formed of materials with different oxidation rates. The source/drain regions are recessed in the following manner. To begin with, surface regions are removed by anisotropic etching and the substrate is exposed. After the substrate is oxidized, the oxidized films formed by the oxidation are removed by the wet process. Thus, the depth of the source/drain can be increased, and the performance of the MOS transistor can be enhanced. Since it is possible to prevent the mask material on the gate electrode from being excessively etched, electrical short between neighboring MOS transistors and between source/drain and gate electrode can be prevented.

In the first to fifth embodiments, SiGe is used as materials of the substrate and the source/drain, and Si is used as the material of the surface region including the channel. However, if the conditions relating to the oxidation rates of the substrate and surface region and the kind of stress introduced to the surface region are satisfied, these materials are not limited. For instance, materials shown in FIG. 23 to FIG. 25 are usable.

Figure 23:
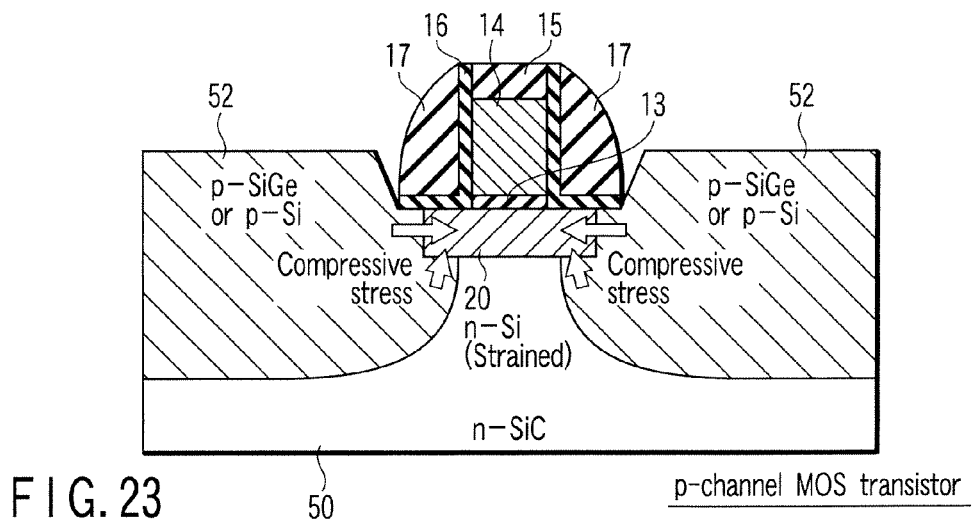
FIG. 23 is a cross-sectional view of a semiconductor device according to a modification of the second embodiment.

FIG. 23 is a cross-sectional view of a p-channel MOS transistor. As shown in FIG. 23, in the structure shown in FIG. 12 which has been described in connection with the second embodiment, an SiC layer 50 is substituted for the SiGe layer 10. In this case, an Si layer 52 may be substituted for the SiGe layer 12. In the present structure, SiC having a smaller lattice constant than Si is used for the substrate 50. Accordingly, the lattice constant of the Si layer 20, which is formed by using strained silicon, is less than that of Si. Hence, a compressive stress can be introduced to the Si layer 20 by using SiGe and Si for the source and drain.

Figure 24:
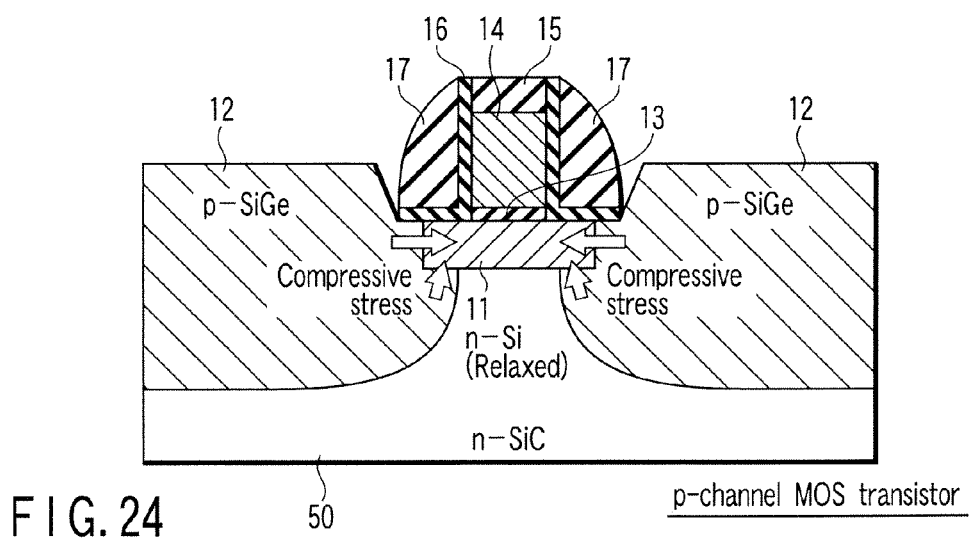
FIG. 24 is a cross-sectional view of a semiconductor device according to a modification of the first embodiment.

FIG. 24 is a cross-sectional view of a p-channel MOS transistor. As shown in FIG. 24, in the structure shown in FIG. 1 which has been described in connection with the first embodiment, an SiC layer 50 may be substituted for the SiGe layer 10.

Figure 25:
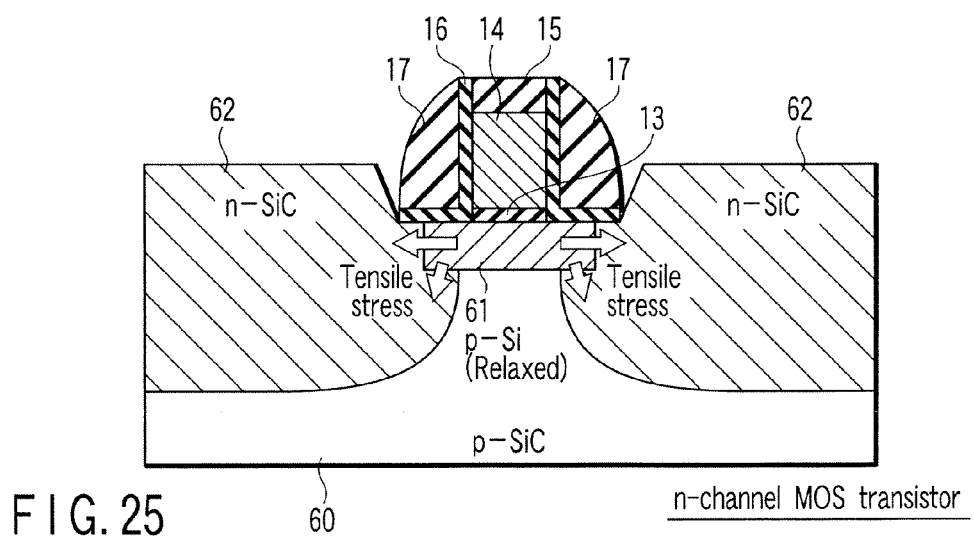
FIG. 25 is a cross-sectional view of a semiconductor device according to a modification of the third embodiment.

FIG. 25 is a cross-sectional view of an n-channel MOS transistor. As shown in FIG. 25, in the structure shown in FIG. 13 which has been described in connection with the third embodiment, an SiC layer 60 is substituted for the SiGe layer 30, an unstrained Si layer 61 (with a thickness not less than the critical thickness at which the stress due to lattice mismatching with SiC is relaxed) is substituted for the Si layer 31, and an SiC layer 62 is substituted for the SiGe layer 32. With this structure, a tensile stress can be introduced to the Si layer 61 by the SiC layer 62 having a smaller lattice constant than Si.

Not only the SiC, but also GaAs is usable as material. In addition, a ternary compound semiconductor or a quaternary compound semiconductor, which includes In, Al, etc. in addition to GaAs, is usable. Besides, the SiGe layer 10, 30, which serves as the substrate, may be formed, for example, on an insulating film that is formed on a silicon substrate (SGOI structure), or it may be a bulk SiGe substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
   a first semiconductor layer;
   an n-type second semiconductor layer which is formed on the first semiconductor layer and has an oxidation rate which is lower than an oxidation rate of the first semiconductor layer;
   p-type third semiconductor layers which are formed spaced apart from each other on the first semiconductor layer to sandwich the second semiconductor layer and have a bottom portion deeper than that of the second semiconductor layer, a lattice constant of the second semiconductor layer being less than a lattice constant of the third semiconductor layer; and
   a first gate electrode which is formed on the second semiconductor layer between the neighboring third semiconductor layers with a first gate insulation film interposed between the second semiconductor layer and the first gate electrode,
   wherein the second semiconductor layer has a lattice constant inherent to a material, of which the second semiconductor layer is formed, and
   a lattice constant of the first semiconductor layer is less than the lattice constant of the third semiconductor layer.

2. The device according to claim 1, wherein the first semiconductor layer includes an n-type region and a p-type region, and
   the second semiconductor layer is formed on the n-type region,
   the device further comprising:
   a p-type fourth semiconductor layer which is formed on the p-type region of the first semiconductor layer and has an oxidation rate which is lower than an oxidation rate of the first semiconductor layer, a lattice constant of the fourth semiconductor layer being greater than a lattice constant inherent to a material, of which the fourth semiconductor layer is formed when no stress is applied;
n-type fifth semiconductor layers which are formed spaced apart from each other on the first semiconductor layer to sandwich the fourth semiconductor layer and have a bottom portion deeper than that of the fourth semiconductor layer, a lattice constant of the fifth semiconductor layer being less than a lattice constant of the first semiconductor layer, the first, third and fifth semiconductor layers being formed of the same material which is different from a material of the second and fourth semiconductor layers; and
a second gate electrode which is formed on the fourth semiconductor layer between the neighboring fifth semiconductor layers with a second insulation film interposed between the fourth semiconductor layer and the second gate electrode.

3. A semiconductor device comprising:
a first semiconductor layer;
an n-type second semiconductor layer which is formed on the first semiconductor layer and has an oxidation rate which is lower than an oxidation rate of the first semiconductor layer;
p-type third semiconductor layers which are formed spaced apart from each other on the first semiconductor layer to sandwich the second semiconductor layer and have a bottom portion deeper than that of the second semiconductor layer, a lattice constant of the second semiconductor layer being less than a lattice constant of the third semiconductor layer; and
a first gate electrode which is formed on the second semiconductor layer between the neighboring third semiconductor layers, with a first gate insulation film interposed between the second semiconductor layer and the first gate electrode,
wherein the second semiconductor layer has a lattice constant inherent to a material, of which the second semiconductor layer is formed,
the first semiconductor layer and the third semiconductor layer are formed of a material of SiGe, and
a Ge composition ratio in the first semiconductor layer is lower than a Ge composition ratio in the third semiconductor layer.

4. The device according to claim 3, wherein the first semiconductor layer includes art n-type region and a p-type region, and
the second semiconductor layer is formed on the n-type region,
the device further comprising:
a p-type fourth semiconductor layer which is formed on the p-type region of the first semiconductor layer and has an oxidation rate which is lower than an oxidation rate of the first semiconductor layer, a lattice constant of the fourth semiconductor layer being greater than a lattice constant inherent to a material, of which the fourth semiconductor layer is formed when no stress is applied;
n-type fifth semiconductor layers which are formed spaced apart from each other on the first semiconductor layer to sandwich the fourth semiconductor layer and have a bottom portion deeper than that of the fourth semiconductor layer, a lattice constant of the fifth semiconductor layer being less than a lattice constant of the first semiconductor layer, the first, third and fifth semiconductor layers being formed of the same material which is different from a material of the second and fourth semiconductor layers; and
a second gate electrode which is formed on the fourth semiconductor layer between the neighboring fifth semiconductor layers with a second insulation film interposed between the fourth semiconductor layer and the second gate electrode.

5. A semiconductor device comprising:
a first semiconductor layer;
an n-type second semiconductor layer which is formed on the first semiconductor layer and has an oxidation rate which is lower than an oxidation rate of the first semiconductor layer;
p-type third semiconductor layers which are formed spaced apart from each other on the first semiconductor layer to sandwich the second semiconductor layer and have a bottom portion deeper than that of the second semiconductor layer, a lattice constant of the second semiconductor layer being less than a lattice constant of the third semiconductor layer; and
a first gate electrode which is formed on the second semiconductor layer between the neighboring third semiconductor layers, with a first gate insulation film interposed between the second semiconductor layer and the first gate electrode,
wherein the first semiconductor layer includes an n-type region and a p-type region, and
the second semiconductor layer is formed on the n-type region,
the device further comprising:
a p-type fourth semiconductor layer which is formed on the p-type region of the first semiconductor layer and has an oxidation rate which is lower than an oxidation rate of the first semiconductor layer, a lattice constant of the fourth semiconductor layer being greater than a lattice constant inherent to a material, of which the fourth semiconductor layer is formed when no stress is applied;
n-type fifth semiconductor layers which are formed spaced apart from each other on the first semiconductor layer to sandwich the fourth semiconductor layer and have a bottom portion deeper than that of the fourth semiconductor layer, a lattice constant of the fifth semiconductor layer being less than a lattice constant of the first semiconductor layer, the first, third and fifth semiconductor layers being formed of the same material which is different from a material of the second and fourth semiconductor layers; and
a second gate electrode which is formed on the fourth semiconductor layer between the neighboring fifth semiconductor layers, with a second insulation film interposed between the fourth semiconductor layer and the second gate electrode.

6. The device according to claim 5, wherein the second semiconductor layer has a lattice constant inherent to a material, of which the second semiconductor layer is formed, and
the first semiconductor layer and the third semiconductor layer have a substantially equal lattice constant.

7. The device according to claim 5, wherein the second semiconductor layer has a lattice constant inherent to a material, of which the second semiconductor layer is formed,
the first semiconductor layer and the third semiconductor layer are formed of a material of SiGe, and
the first semiconductor layer and the third semiconductor layer have a substantially equal Ge composition ratio.

8. The device according to claim 5, wherein the lattice constant of the second semiconductor layer is greater than a lattice constant inherent to a material, of which the second semiconductor layer is formed, and a lattice constant of the first semiconductor layer is less than the lattice constant of the third semiconductor layer.

9. The device according to claim 8, wherein the first semiconductor layer and the second semiconductor layer have a substantially equal lattice constant.

10. The device according to claim 5, wherein the lattice constant of the second semiconductor layer is greater than a lattice constant inherent to a material, of which the second semiconductor layer is formed, the first semiconductor layer and the third semiconductor layer are formed of a material of SiGe, and a Ge composition ratio in the first semiconductor layer is lower than a Ge composition ratio in the third semiconductor layer.

11. The device according to claim 10, wherein the second semiconductor layer is formed of a material of Si, and the second semiconductor layer has a lattice constant which is substantially equal to a lattice constant of the first semiconductor layer.

* * * * *